United States Patent [19]

Allen

[11] Patent Number: 4,914,318

[45] Date of Patent: Apr. 3, 1990

[54] LATCH CIRCUIT FOR A PROGRAMMABLE LOGIC DEVICE USING DUAL N-TYPE TRANSISTORS

[75] Inventor: Michael J. Allen, Rescue, Calif.

[73] Assignee: Intel Corporation, Santa Clara, Calif.

[21] Appl. No.: 292,305

[22] Filed: Dec. 30, 1988

[51] Int. Cl.[4] .......................................... H03K 3/356
[52] U.S. Cl. .................................. 307/272.2; 307/443; 307/451; 307/491; 307/279
[58] Field of Search ............... 307/279, 475, 448, 443, 307/451, 452, 453, 355, 292, 558–559, 272.2, 291

[56] References Cited

U.S. PATENT DOCUMENTS

| | | | |
|---|---|---|---|
| 4,810,969 | 3/1989 | Fulkerson | 307/448 |
| 4,820,942 | 4/1989 | Chan | 307/443 |
| 4,849,653 | 7/1989 | Imai et al. | 307/290 |

Primary Examiner—Stanley D. Miller
Assistant Examiner—Terry Cunningham
Attorney, Agent, or Firm—Blakely, Sokoloff, Taylor & Zafman

[57] ABSTRACT

A latch circuit having a dual n-type driver transistors to provide an output which is compatible to TTL and CMOS. A complimentary pair of input signals is coupled to drive a pair of input transistors which are enabled by a clocking signal. The input transistors are driven by a cross-coupled inverters such that the output of each inverter is coupled to a gate of one or the other of the n-type driver transistors. The use of dual n-type transistors as a driver provides for a more symmetrical output wherein limiting the $V_{oh}$ of the output voltage provides for improved speed performance and reduces noise.

7 Claims, 2 Drawing Sheets

FIG_1 (PRIOR ART)
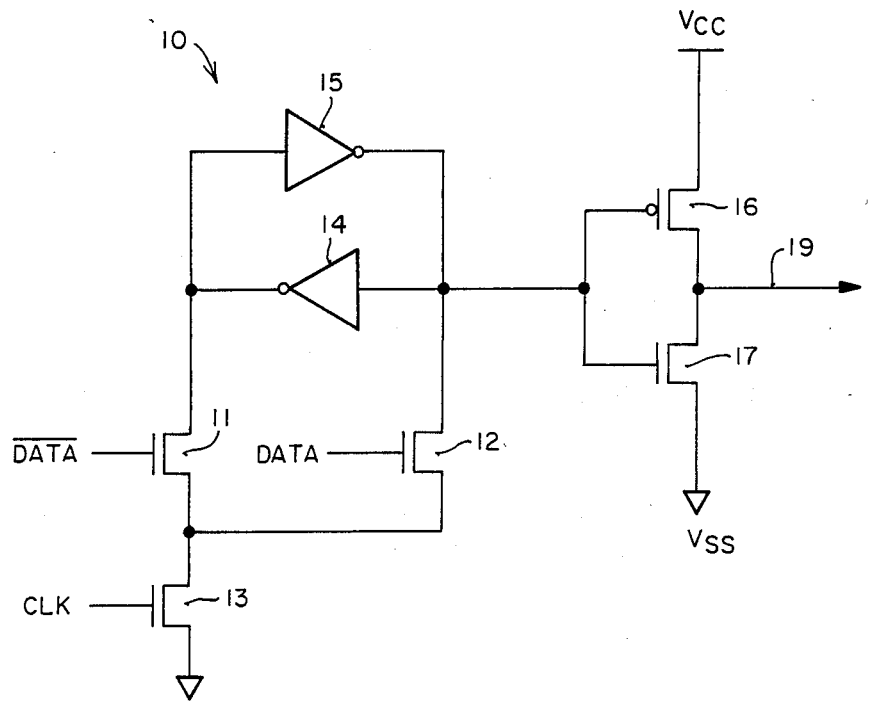
FIG_2
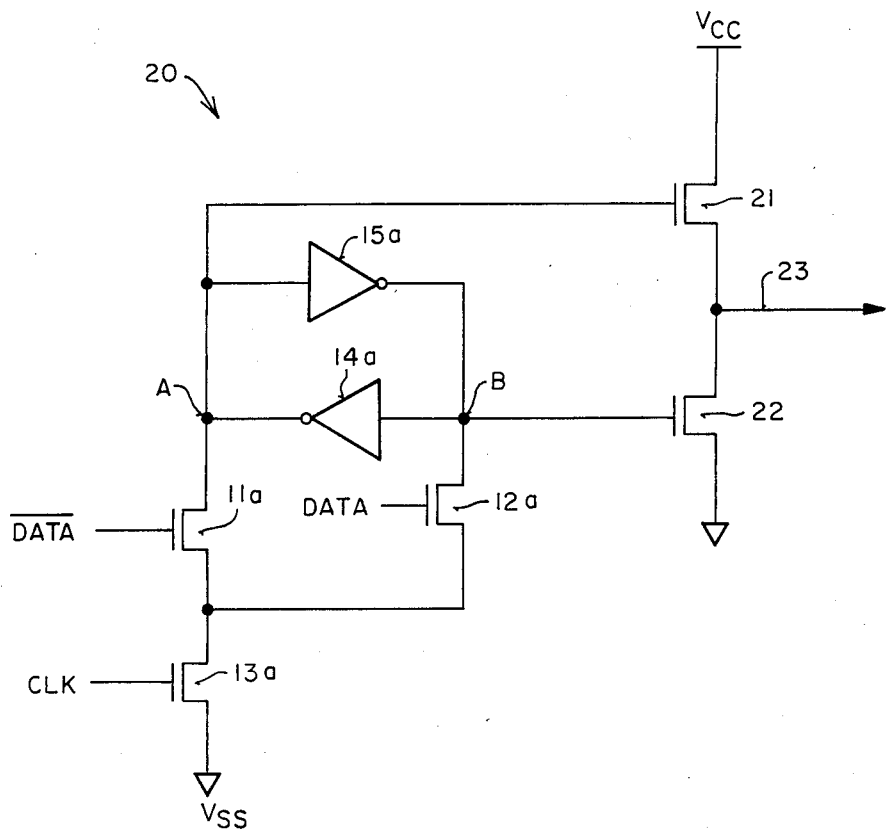

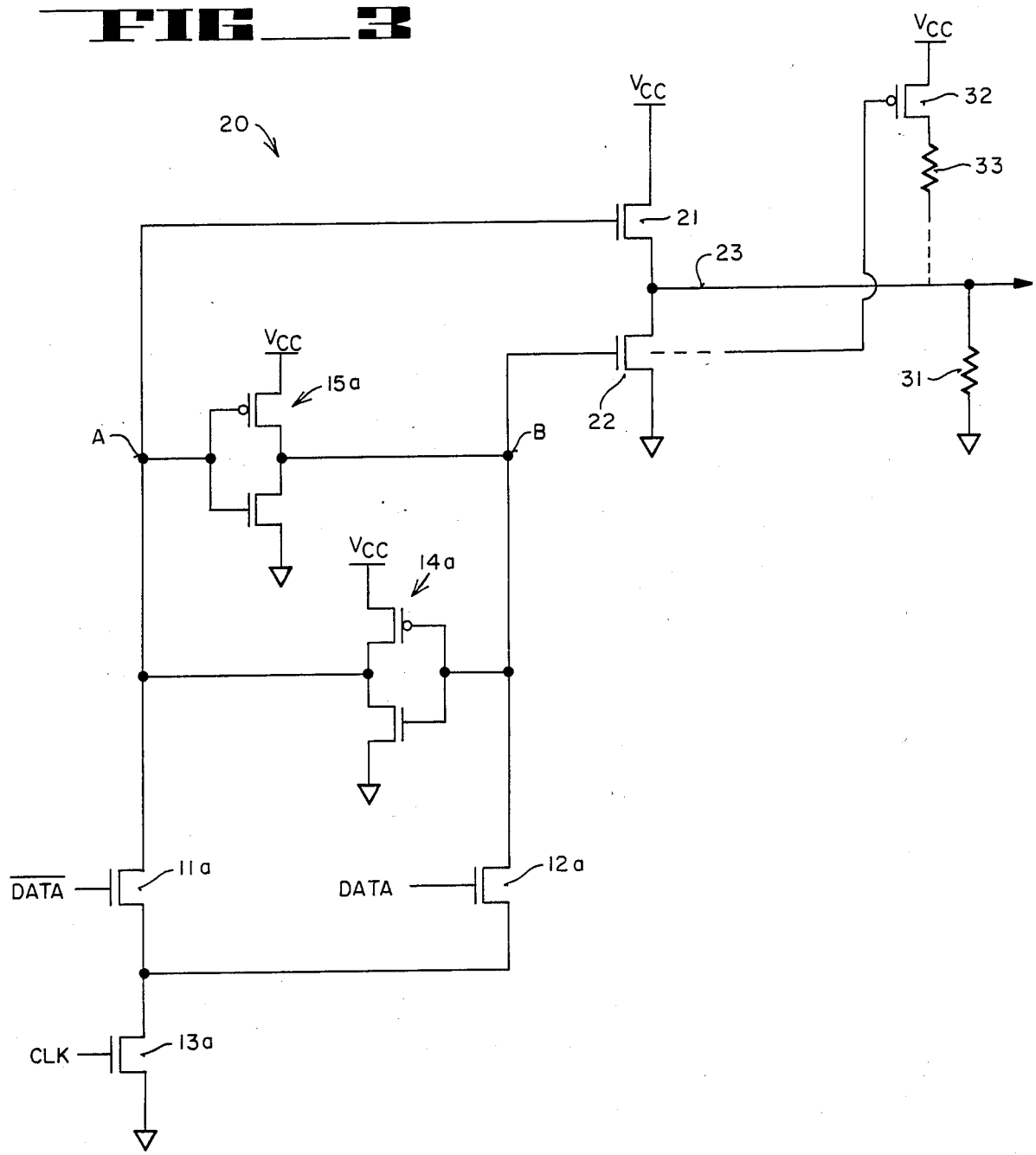
FIG_3

LATCH CIRCUIT FOR A PROGRAMMABLE LOGIC DEVICE USING DUAL N-TYPE TRANSISTORS

BACKGROUND OF THE INVENTION

1. Field of the Invention

The present invention relates to the field of programmable logic devices and more specifically to a latch circuit having dual n-type transistor drivers.

2. Prior Art

The manufacture and use of programmable logic devices (PLDs) which includes a memory array for programming the PLD are well known in the prior art. In many instances, erasable programmable read-only memory (EPROM) arrays are used in the PLD. The memory array is programmable wherein the stored program in combination with the logic provided in the macrocells provide for customization of a PLD for a particular application. Various PLD architectures are known in the prior art. For example, two U.S. Pat. Nos. to Hartmann et al., 4,609,986 and 4,617,479, as well as a patent to Birkner et al., 4,124,899, disclose and teach examples of prior art programmable logic arrays. An application of a PLD is taught in Hallenbeck et al., 4,761,647.

Generally, memory arrays of a PLD are arranged into a row and column matrix wherein inputs are coupled to the various row lines and outputs from the memory are obtained from the column lines of the memory array. In the operation of a PLD, latches or latch/registers are needed for latching information to and from the PLD. For example, when input signals are to be coupled to the input of the memory array, latches are typically used to latch in the information. Furthermore, when information is coupled as an output, latches are also used to latch the output of the memory array to the macrocells. Therefore, although latches are not essential to the operation of a PLD, they are typically used to latch and store information.

When a complementary metal-oxide-semiconductors (CMOS) technology is used to design a given device, latches for the device are also designed using this CMOS technology. Designs utilizing CMOS technology use a pair of CMOS transistors to provide the basic driver function. That is, a typical CMOS driver is comprised of a p-type transistor and a n-type transistor coupled in series between Vcc and Vss, wherein the output of the driver is taken at the drain junction of the two transistors. The gates of the two transistors are coupled together, such that when driven, one or the other transistor conducts causing the output to latch to vcc or Vss. However, the standard CMOS driver exhibits certain properties which are disadvantageous when implemented in a CMOS PLD. The present invention provides an improved latch circuit for latching information in a CMOS device and particularly in a CMOS PLD.

SUMMARY OF THE INVENTION

A latch circuit having a dual n-type transistor output driver is described. A differential input signal is coupled to two differential input transistors having cross-coupled drivers. The input transistors are enabled by a clocking signal once valid data is present. One node of the crosscoupled inverters is coupled to a gate of a first n-type transistor and the other node of the cross-coupled inverters is coupled to a second n-type transistor. The two n-type transistors are coupled in series between vcc and ground and the output is taken at the junction of the two n-type transistors. By using a dual n-type transistor driver arrangement, not only CMOS, but TTL compatible circuits can be driven. Further, because of the symmetry provided by the dual n-type transistors, speed of the latching circuit is increased while noise reduction is improved.

BRIEF DESCRIPTION OF THE DRAWINGS

FIG. 1 is a circuit schematic diagram showing a prior art CMOS latching circuit.

FIG. 2 is a circuit schematic diagram showing a latch circuit of the present invention.

FIG. 3 is a circuit schematic diagram showing a latch circuit of the preferred embodiment with output loads.

DETAILED DESCRIPTION THE PRESENT INVENTION

A latch circuit using dual n-type transistors is described. In the following description, numerous specific details are set forth, such as a specific use of the latch circuit of the present invention, in order to provide a thorough understanding of the present invention. It will be obvious, however, to one skilled in the art that the present invention may be practiced without these specific details. In other instances, well-known circuits have not been described in detail in order not to unnecessarily obscure the present invention. Further, although the preferred embodiment is described in conjunction with a PLD memory array, it is evident to those skilled in the art that the present invention can be practiced with other devices or incorporated in other circuits.

Referring to FIG. 1, a prior art latch circuit 10 is shown. Latch circuit 10 is comprised of transistors 11, 12, 13; inverters 14 and 15, and a CMOS output driver comprised of transistors 16 and 17. An input signal and its complement, shown as DATA and DATA/ (/ is hereinafter used to denote a complement of a signal) are coupled to the gates of transistors 12 and 11, respectively. Inverters 14 and 15 are coupled such that the output of one is coupled to the input of the other. The output of transistor 11 is coupled to the input of inverter 15 and the output of transistor 12 is coupled to the input of inverter 14. The other terminals of transistors 11 and 12 are coupled together through transistor 13 to ground.

A clocking signal CLK is coupled to the gate of transistor 13 and is used to enable circuit 10. The node which comprise the output of inverter 15 and the input to inverter 14 is coupled to the gates of transistors 16 and 17. Transistors 16 and 17 form a CMOS driver pair wherein an output from the driver stage on output line 19 is taken at the junction of transistors 16 and 17.

A major disadvantage of circuit 10 is in the use of a CMOS transistor pair to provide the output drive stage stage from circuit 10. The use of a CMOS driver causes the output line 19 to transition between Vcc and Vss, which in this case is ground. For example, if Vcc is 5 volts DC, then output line 19 must transition between 5 volts and ground (0 volts). It is to be appreciated that some finite amount of time is required for transistors 16 and 17 to transition from conducting to non-conducting, or non-conducting to conducting states, which ultimately impacts the transitioning time of the output line between its high and low states.

Referring to FIG. 2, a latch circuit 20 of the present invention is shown. Circuit 20 is comprised of transistors 11a, 12a, 13a and inverters 14a and 15a, which components are coupled equivalently to those components having the same reference numeral in FIG. 1. A suffix "a" has been added to those equivalent components in FIG. 2. Accordingly, input signal DATA is coupled as an input to the gate of transistor 12a and DATA/ is coupled to the gate of transistor 11a. Clocking signal CLK is coupled to the gate of transistor 13a. The sources of transistors 11a and 12a are coupled together to the drain of transistor 13a. When the clocking signal CLK causes transistor 13a to conduct, the sources of transistors 11a and 12a are coupled to Vss or ground.

Inverters 14a and 15a are cross-coupled between nodes A and B. The drain of transistor 11a is coupled to node A and the drain of transistor 12a is coupled to node B. The output of inverter 14a and the input of inverter 15a are also coupled to node A, and the output of inverter 15a and the input of inverter 14a are coupled to node B.

Unlike the CMOS driver of the prior art circuit 10 of FIG. 1, the output driver stage of latch 20 is comprised of two n-type transistors 21 and 22. Transistors 21 and 22 are coupled in series between Vcc and ground and the output is taken at the junction of the two transistors 21 and 22. In circuit 20, the drain of transistor 21 is coupled to Vcc and the source of transistor 22 is coupled to ground. The source of transistor 21 and the drain of transistor 22 are coupled together to output line 23. Again, unlike the driver transistors 16 and 17 of circuit 10, the gates of transistors 21 and 22 are driven from separate nodes. The gate of transistor 21 is coupled to node A and the gate of transistor 22 is coupled to node B. A purpose of the cross-coupled inverters 14a and 15a is to provide a driving force onto nodes A and B respectively.

In operation, once valid data is present at the gates of transistors 11a and 12a, the clocking signal CLK goes high causing transistor 13a to conduct. The conduction of transistor 13a places a low potential on the sources of transistors 11a and 12a. Because the inputs to the gates of transistors 11a and 12a are complementary inputs, only one transistor 11a or 12a will conduct. Respectively, this causes either node A or B to transition to a low state and the non-conducting transistor of the transistor pair 11a and 12a will have its respective output node at a high state. If node A is at a high state, then transistor 21 conducts placing a high potential onto output line 23. Alternatively, if node A is low and node B is high, then transistor 22 conducts placing a low potential on output line 23. Inverters 14a and 15a are CMOS drivers utilized for the purpose of driving nodes A and B, respectively.

A number of advantages are derived by the implementation of latch circuit 20 over the prior art circuit 10. For example, because of the use of dual n-type transistors, transistor-transistor-logic (TTL) compatible drive currents can be provided on output line 23. Because of the use of two n-type transistors 21 and 22, it can be insured that one transistor 21 or 22 will be turned off prior to the other transistor 22 or 21 being turned on. Inhibiting the conduction of both transistors reduces cross-over current during state changes, as well as reducing Vcc and ground noise. The input signals, which are differential signals, provide for a symmetrical operation. The symmetry is enhanced by having two n-type devices at the output.

Referring to FIG. 3, the preferred embodiment showing an expanded circuit 20 is shown. Each of the inverters 14a and 15a are now shown in expanded form, wherein a pair of CMOS transistors are utilized for each inverter 14a and 15a. In one embodiment, resistor 31 is coupled between the output line 23 and ground. The placing of resistor 31 as a load resistor to ground causes the high state output voltage on output line 23 to be limited to a fraction of the Vcc voltage. For example, if Vcc is 5 volts, $V_{oh}$ (high state output voltage) can be limited to 3 volts and this can be achieved with only modest power dissipation.

Limiting the voltage swing of the output line 23 to between 0 and 3 volts has a number of advantages. For example, transition time is reduced because typically it takes less time to transition between 3 and 0 volts than it does between 5 and 0 volts. Further, because an output capacitance exists at the output node, it will need to be discharged. Discharging from 3 volts to 0 volts when transistor 22 is activated, occurs in a shorter time than if the capacitor is fully charged to the full value of Vcc, such as 5 volts in this example. The output capacitance, which can be in the form of distributed capacitance, must be discharged before the output line 23 can be forced to a low potential. Because the charging of the output capacitance is limited to approximately 3 volts, the ground noise is also reduced due to the reduction of the peak di/dt of the discharging capacitor.

Therefore, the use of the dual n-type transistor driver and the use of resistor 31 allows for circuit 20 to operate at a faster speed and with improved noise reduction over prior art circuits, such as circuit 10 of FIG. 1. It is to be appreciated that resistor 31 can be an external resistor coupled to output line 23. Further, other components which provide an equivalent function as resistor 31 can be used. If the output on output line 2 is to be coupled to a full CMOS system with less stringent performance demands, resistor 31 can be removed and replaced with a p-type transistor 32 in combination with a resistor 33 between Vcc and output line 23. The gate of the p-type transistor 32 would be coupled to node B.

In another embodiment, a leaker p-type transistor can be used to provide an equivalent function as transistor 32 and resistor 33. Further, leaker p-type devices can be replaced with depletion or intrinsic n-type devices to provide equivalent functions. Although a variety of components can be coupled to the output line 23, the symmetrical operation of circuit 20, wherein a symmetrical output is provided on output line 23, is provided by the dual n-type transistor 21 and 22 configuration. Further, the latch circuit of the present invention can also be utilized as an output latch or as an output register to an EPROM array.

I claim:

1. In a complementary-metal-oxide-semiconductor (CMOS) integrated circuit, a latch circuit comprising:
   a first CMOS driver coupled between a first input node and a second input node for driving said first input node;
   a second CMOS driver coupled between said first input node and said second input node for driving said second input node;
   a first n-type driver transistor coupled to have its gate driven by said second input node, its drain coupled to an output node and its source coupled to a supply return;

a second n-type driver transistor coupled to have its gate driven by said first input node, its source coupled to said output node and its drain coupled to a supply voltage, wherein having said two n-type driver transistors ensures that one is turned off prior to the other between turned on in order to provide a symmetrical output.

2. The circuit of claim 1 further including a clocking transistor coupled to said two input nodes for coupling complementary pair of data signals to said two input nodes.

3. A complementary-metal-oxidesemiconductor (CMOS) latch circuit, comprising:
   a first input transistor having its gate coupled to receive an input signal and its drain coupled to a first node;
   a second input transistor having its gate coupled to receive a complement of said input signal and its drain coupled to a second node;
   an enabling transistor having its gate coupled to a clocking signal, such that said clocking signal activates said enabling transistor, said enabling transistor having its drain coupled to the sources of said first and second input transistors and having its source coupled to a supply voltage return;
   a first n-type transistor having its gate coupled to said second node, its drain coupled to a supply voltage and its source coupled to an output node;
   a second n-type driver transistor having its gate coupled to a first node, its drain coupled to said output node and its source coupled to said power supply return, wherein symmetrically driven output is provided on said output node.

4. The latch circuit of claim 3 further including:
   a first CMOS driver coupled between said first node and said second node for driving said first node;
   and a second CMOS driver coupled between said first node and said second node for driving said second node.

5. The latch circuit of claim 4 wherein said input signal and its complement are differential signals.

6. The latch circuit of claim 5 further including a resistor coupled between said output node and said supply return for causing said output node to be driven to a fraction of said supply voltage.

7. The latch circuit of claim 6 wherein said output node varies between 0 volts and approximately 60% of said supply voltage.

* * * * *

UNITED STATES PATENT AND TRADEMARK OFFICE
CERTIFICATE OF CORRECTION

PATENT NO. : 4,914,318

DATED : 4/3/90

INVENTOR(S) : Allen

It is certified that error appears in the above-identified patent and that said Letters Patent is hereby corrected as shown below:

Col. 04, line 38      delete "line 2"      insert --line 23--

Signed and Sealed this

Sixth Day of April, 1993

*Attest:*

STEPHEN G. KUNIN

*Attesting Officer*      *Acting Commissioner of Patents and Trademarks*